US008748860B2

(12) United States Patent
Chae et al.

(10) Patent No.: US 8,748,860 B2
(45) Date of Patent: Jun. 10, 2014

(54) PHASE CHANGE MEMORY DEVICE HAVING SELF-ALIGNED BOTTOM ELECTRODE AND FABRICATION METHOD THEREOF

(71) Applicant: SK hynix Inc., Gyeonggi-do (KR)

(72) Inventors: Su Jin Chae, Gyeonggi-do (KR); Jin Hyock Kim, Gyeonggi-do (KR); Young Seok Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/711,804

(22) Filed: Dec. 12, 2012

(65) Prior Publication Data
US 2014/0054752 A1 Feb. 27, 2014

(30) Foreign Application Priority Data

Aug. 24, 2012 (KR) .......... 10-2012-0093196

(51) Int. Cl.
H01L 23/28 (2006.01)
(52) U.S. Cl.
USPC .. 257/2; 257/4; 257/5; 257/295; 257/E29.005

(58) Field of Classification Search
USPC .................................. 257/295, 2–5
See application file for complete search history.

(56) References Cited

U.S. PATENT DOCUMENTS

2008/0315172 A1* 12/2008 Happ et al. .......... 257/4

FOREIGN PATENT DOCUMENTS

KR 1020090070304 7/2009
KR 1020110106712 9/2011

* cited by examiner

Primary Examiner — Thanh Nguyen
(74) Attorney, Agent, or Firm — IP & T Group LLP

(57) ABSTRACT

A semiconductor memory device and a fabrication method thereof capable of improving electric contact characteristic between an access device and a lower electrode are provided. The semiconductor memory device includes an access device formed in a pillar shape on a semiconductor substrate, a first conductive layer formed over the access device, a protection layer formed on an edge of the first conductive layer to a predetermined thickness, and a lower electrode connected to the first conductive layer.

3 Claims, 6 Drawing Sheets

PHASE CHANGE MEMORY DEVICE HAVING SELF-ALIGNED BOTTOM ELECTRODE AND FABRICATION METHOD THEREOF

CROSS-REFERENCES TO RELATED APPLICATION

This application claims priority under 35 U.S.C. 119(a) to Korean application number 10-2012-0093196, filed on Aug. 24, 2012, in the Korean Patent Office, which is incorporated by reference in its entirety.

BACKGROUND OF THE INVENTION

1. Technical Field

The embodiments of the present invention relate to a semiconductor device, and more particularly, to a semiconductor memory device and a method of fabricating the same.

2. Related Art

Semiconductor devices have been highly integrated, and a reduction rate of the semiconductor device has also increased. According to this, when memory devices such as phase-change random access memories (PRAMs), resistive RAMs (ReRAMs), and magnetic RAMs (MRAMs) are fabricated, an access device and a lower electrode are formed in a self-aligned manner.

FIGS. 1 to 4 are views illustrating a method of fabricating a conventional semiconductor memory device and specifically illustrate a method of forming an access device and a lower electrode in a self-aligned manner.

First, as shown in FIG. 1, an access device D, 103 and 105, a first conductive layer 107, and a sacrificial layer 109 are sequentially formed on a semiconductor substrate 101 in which a bottom structure such as a word line (not shown) is formed.

A second conductive layer 111 for reduction of a contact resistance may be further formed between the semiconductor substrate 101 and the access device D. Furthermore, the access device D may include a first type doping layer 103 and a second type doping layer 105. The first type ion doping layer may include a first type positive (+) ion doping layer 103A and a first type negative (−) ion doping layer 103B. The first type ion may be an N type ion and the second type ion may be a P type ion. FIG. 1 shows an example of the access device D.

Each of the first conductive layer 107 and the second conductive layer 111 may have a stacked structure of a titanium (Ti) layer and a titanium nitride (TiN) layer.

The sacrificial layer 109 is used to define a position of a lower electrode to be formed subsequently to the access device when the active device and the lower electrode are formed in a self-aligned manner. The sacrificial layer 109 is formed using a material selected from nitride and materials including nitride.

As shown in FIG. 2, the sacrificial layer 109, the first conductive layer 107, and the access device D are patterned through an exposure and etching process using a mask to expose a surface of the semiconductor substrate 101. When the second conductive layer 111 is formed between the semiconductor layer 101 and the access device D, the second conductive layer 111 is also patterned in the above-described patterning process.

A pillar type structure 113 is formed by the patterning process. Then, a capping layer 115 is formed on the semiconductor substrate including the pillar type structure, an insulating layer 117 for cell separation is formed, and then a planarization process is performed to expose a surface of the sacrificial layer 109.

The capping layer 115 may include a nitride layer or a material layer including nitride. For example, the capping layer 115 may be formed of silicon nitride ($Si_3N_4$) or silicon oxynitride (SiON). Furthermore, the insulating layer 117 may be formed using nitride or oxide.

Subsequently, the sacrificial layer 109 is removed to expose the first conductive layer 107 and a process for forming the lower electrode on the first conductive layer 107 is performed.

FIG. 3 shows a cross-sectional view after the sacrificial layer 109 is removed. The sacrificial layer 109 formed of nitride may be removed, for example, using phosphoric acid ($H_3PO_4$). At this time, an upper surface and sidewall of the first conductive layer 107 formed below the sacrificial layer 109 may be removed. Thus, the first conductive layer 107 may be thinned in some cells (see A1).

FIG. 4 illustrates a cross-sectional view after a spacer 119 is formed by forming a spacer insulating layer on the semiconductor substrate having a structure as shown in FIG. 3 and then performing a spacer etching process.

In the cell in which the first conductive layer 107 is lost when the sacrificial layer 109 is removed in FIG. 3, the first conductive layer 107 may be further removed due to additional loss in the spacer etching (see A2). Therefore, when a subsequent process of forming the lower electrode is formed, the lower electrode comes in direct contact with the access device D.

Accordingly, a resistance at a contact interface between the access device D and the lower electrode is rapidly increased and this causes a set fail.

SUMMARY

In accordance with an embodiment of the present invention, the semiconductor memory device may include an access device formed in a pillar shape on a semiconductor substrate, a first conductive layer formed over the access device, a protection layer formed on an edge of the first conductive layer to a predetermined thickness, and a lower electrode connected to the first conductive layer.

In accordance with another embodiment of the present invention, the method of fabricating a semiconductor memory device may include sequentially forming an access device, a first conductive layer, a protection layer, and a sacrificial layer on a semiconductor substrate, patterning, in a pillar shape, the sacrificial layer, the protection layer, the first conductive layer, and the access device, burying an insulating layer between pillar shape structures, and performing planarization on the insulating layer to expose a surface of the sacrificial layer, removing the sacrificial layer, and removing the protection layer.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
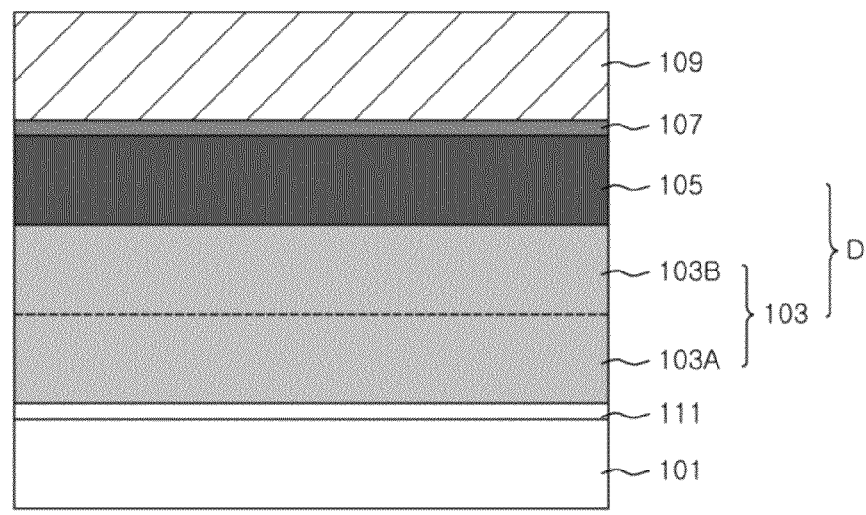
FIGS. 1 to 4 are views illustrating a method of fabricating a general semiconductor memory device.
Figure 2:
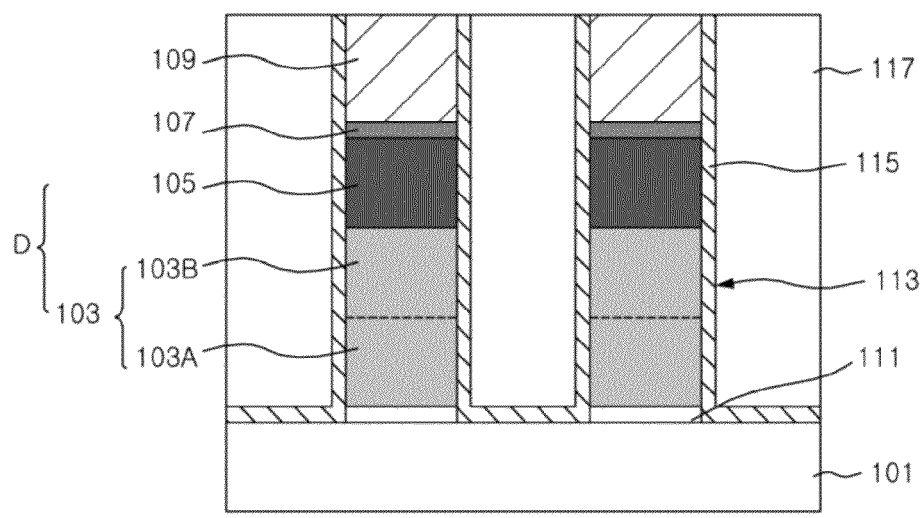
Figure 3:
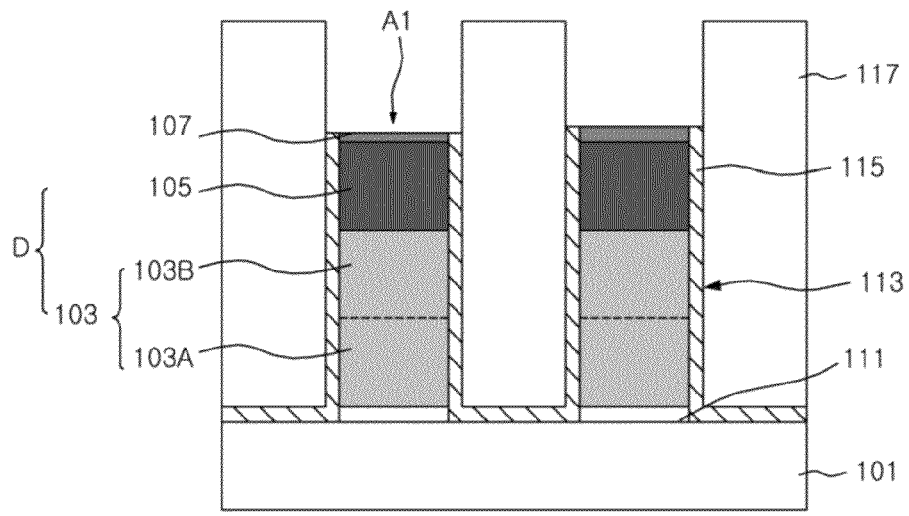
Figure 4:
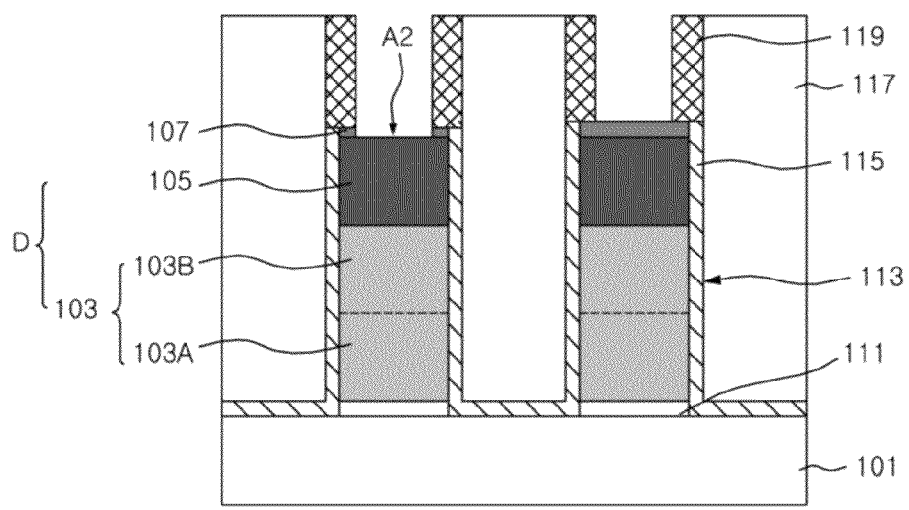

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

It is disclosed in advance that a semiconductor memory device of the inventive concept is a device in which an access device and a lower electrode are formed in a self-aligned manner. Furthermore, the inventive concept may be applied to memory devices having a structure using an access device and a lower electrode such as PRAMS, ReRAMs and MRAMs.

FIGS. 5 to 10 are views illustrating a method of fabricating a semiconductor memory device according to an exemplary embodiment of the inventive concept.

Figure 5:
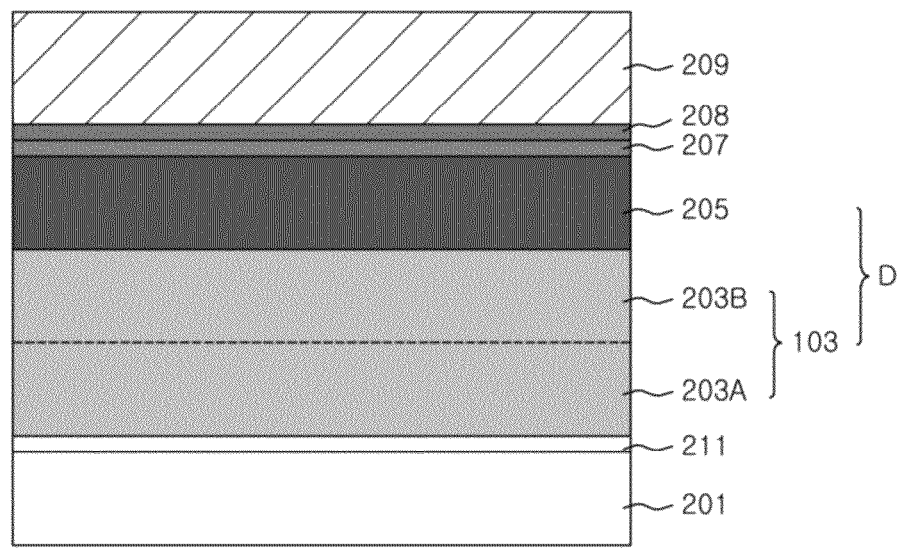
FIGS. 5 to 10 are views illustrating a method of fabricating a semiconductor memory device according to an exemplary embodiment of the inventive concept.

Referring to FIG. 5, an access device D, a first conductive layer 207, a protection layer 208, and a sacrificial layer 209 are sequentially formed on a semiconductor substrate in which a bottom substructure such as a word line (not shown) is formed.

The access device D may include a first type ion doping layer 203 and a second type ion doping layer 205. The first type ion doping layer 203 may include a first type positive (+) ion doping layer 203A and a first type negative (−) ion doping layer 203B. Here, the first type ion may be an N type ion, and the second type ion may be a P type ion. The structure of the access device is not limited thereto and may be selected from among applicable various structures.

The sacrificial layer 209 may include a material selected from nitride or a material including nitride.

The protection layer 208 may be formed using a material that is not removed when the sacrificial layer 209 is removed in a subsequent process. For example, when the sacrificial layer 209 is formed of nitride and is removed using phosphoric acid ($H_3PO_4$), the protection layer 208 may be formed using a material, which is not removed by the phosphoric acid, for example, silicon oxynitride (SiON).

In the exemplary embodiment, the protection layer 208 may be formed to a thickness of about 20 Å to 300 Å. The protection layer 208 may be deposited by a chemical vapor deposition (CVD) method or a physical vapor deposition (PVD) method. In another exemplary embodiment, the protection layer 208 may be formed by including a silicon nitride (SiN) layer and performing an oxidation process on the silicon nitride layer. The oxidation process may be performed using a furnace method or a selective oxidation process so that the first conductive layer 207 is not oxidized and only the silicon nitride (SiN) layer is oxidized.

A second conductive layer 211 is formed between the semiconductor substrate 201 and the access device D to improve a contact resistance. Each of the first conductive layer 207 and the second conductive layer 211 may include a stacked structure of a titanium (Ti) layer and a titanium nitride (TIN) layer, but the structure of the first and second conductive layers is not limited thereto.

In one exemplary embodiment, a cleaning process is performed using a material including hydrogen fluoride (HF) to remove an oxide on a surface of the access device (D) before the first conductive layer 207 is formed after the access device D is formed.

Figure 6:
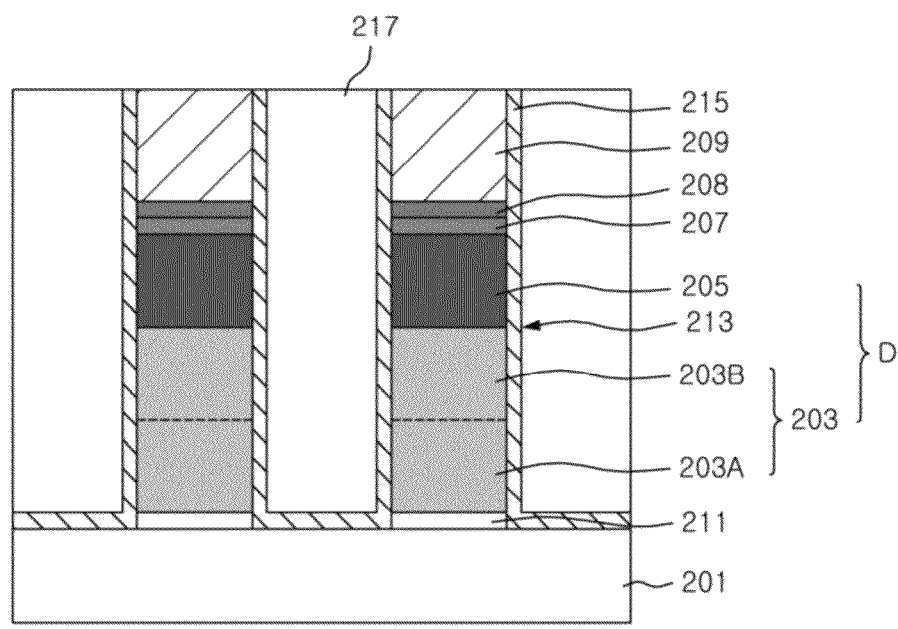

As shown in FIG. 6, the sacrificial layer 209 the protection layer 208, the first conductive layer 207, and the access device D are patterned through an exposure and etching process using a mask to form a pillar type structure 213. When the second conductive layer 211 is formed between the semiconductor substrate 201 and the access device D, the second conductive layer 211 is also patterned in the pattering process.

A capping layer 215 is formed on the semiconductor substrate including the pillar type structure, and an insulating layer 217 is formed to be buried in a space between cells. Then, a planarization process is performed to expose a surface of the sacrificial layer 209.

Here, the capping layer 215 may be a nitride layer or a layer including nitride. For example, the capping layer 215 may include silicon nitride ($Si_3N_4$) or silicon oxynitride (SiON). The insulating layer 217 may include nitride or oxide.

Figure 7:
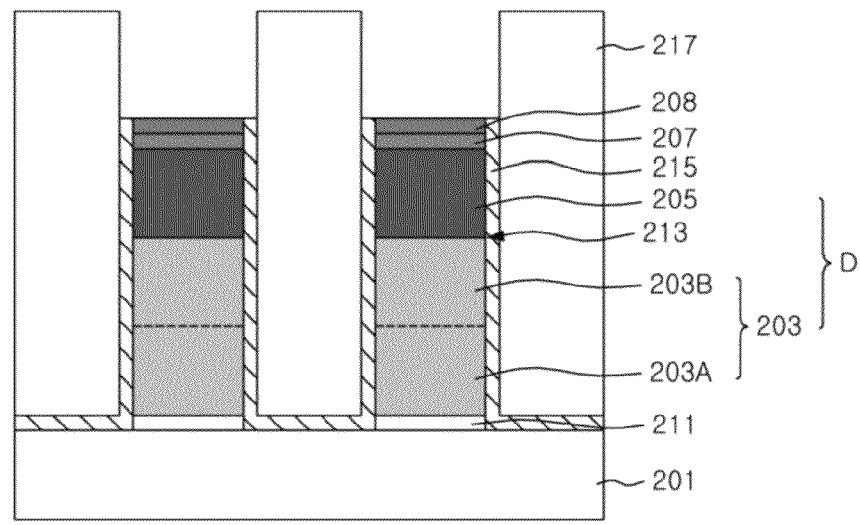

As shown in FIG. 7, the exposed sacrificial layer 209 is removed to expose a lower electrode contact hole. When the sacrificial layer 209 is formed of, for example, nitride, the sacrificial layer 209 may be removed through a dip-out process using phosphoric acid. At this time, since the protection layer 208 is formed of a material that is not removed by phosphoric acid, for example, silicon oxynitride (SiON), the first conductive layer 207 below the protection layer 208 may be stably protected during the process of removing the sacrificial layer 209.

Figure 8:
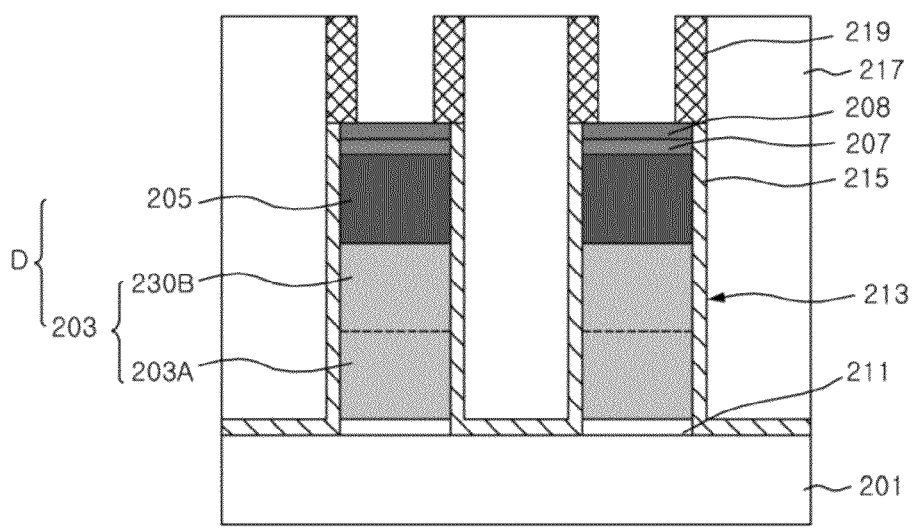

As shown in FIG. 8, an insulating layer is formed on the semiconductor substrate in which the sacrificial layer 209 is removed and spacer-etched to form a spacer 219 on an inner sidewall of the lower electrode contact hole on the access device D. The spacer 219 may be formed using the same material as the protection layer 208 or using a material having the same or similar etching properties as the protection layer 208. For example, the spacer 219 may be formed of a nitride layer or a silicon oxynitride (SiON) layer, but the material for the spacer is not limited thereto.

Figure 9:
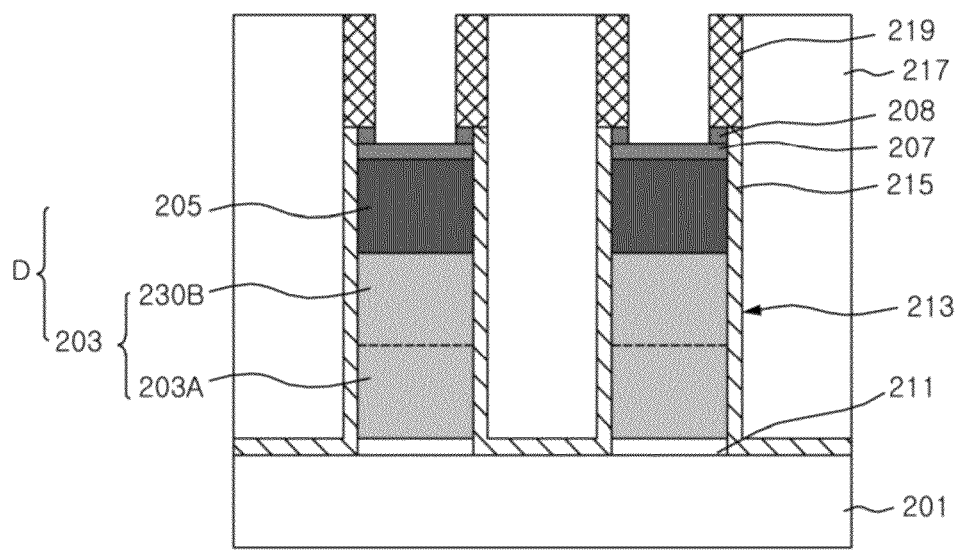

As the etch process of forming the spacer 219 is performed, as shown in FIG. 9, the protection layer 208 is also etched to expose an upper surface of the first conductive layer 207. Therefore, the inner circumference of a lower portion of the lower electrode contact hole may be surrounded by the protection layer 208.

Figure 11:
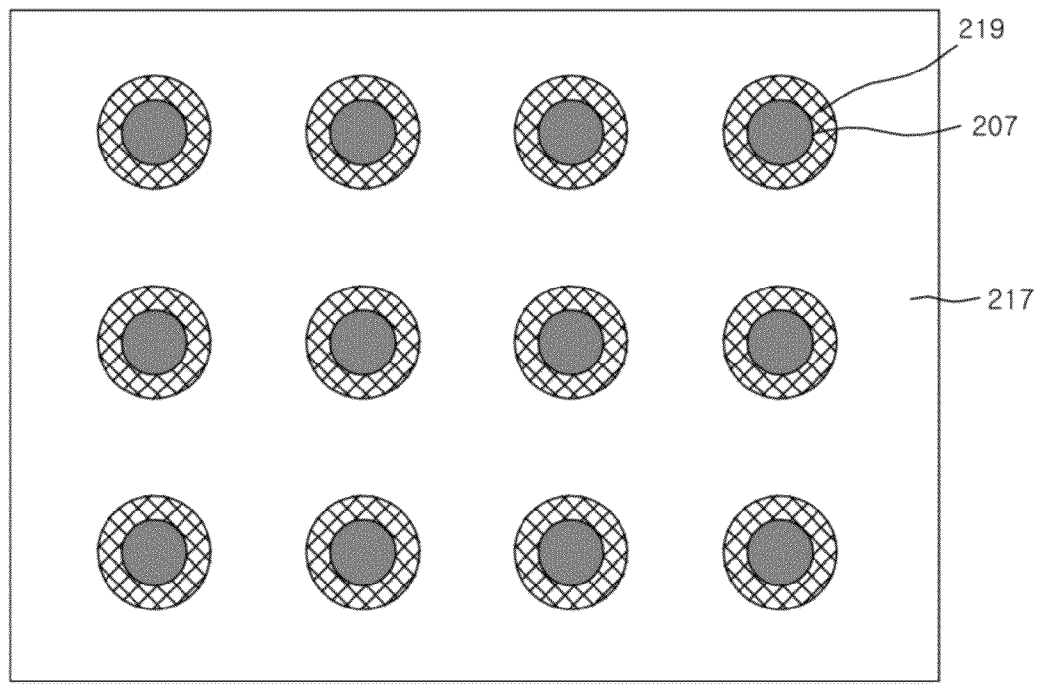
FIGS. 11 and 12 are plan views illustrating a semiconductor memory device illustrated in FIGS. 9 and 10.

FIG. 11 is a plan view after the etch process is completed according to the illustration in FIG. 9.

It can be seen from FIG. 11 that the first conductive layer 207 is exposed in a bottom of the lower electrode contact hole, and the spacer is formed in the inner circumference of the lower portion of the lower electrode contact hole.

Figure 10:
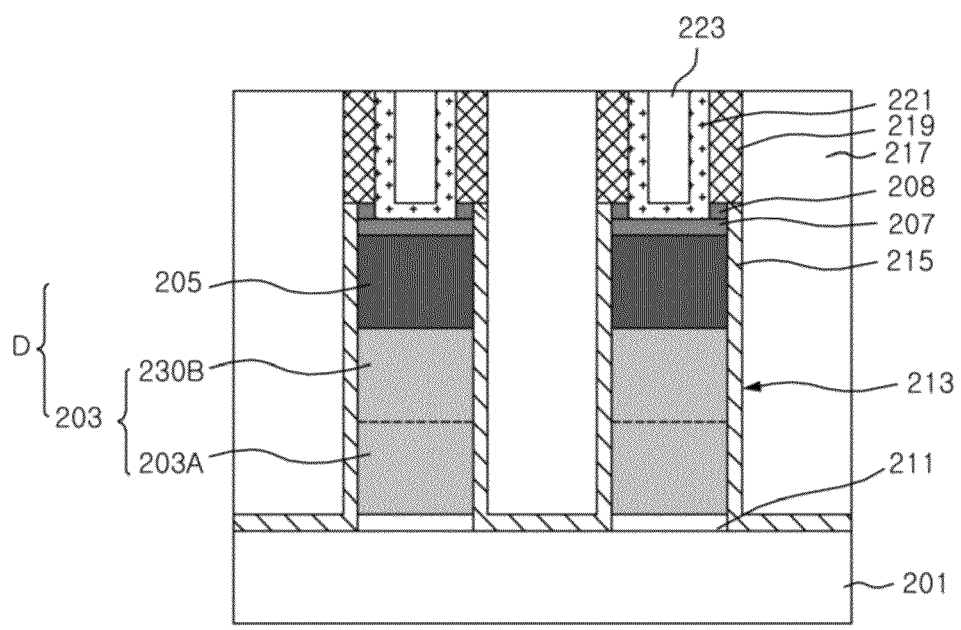

As shown in FIG. 10, after the spacer etch process is completed, a lower electrode 221 is formed on inner surface of the lower electrode contact hole, and a gap-filling layer 223 is buried within the lower electrode contact hole. The gap-filling layer 223 may include, for example, a nitride layer, but the material for the gap-filling layer is not limited thereto.

Figure 12:
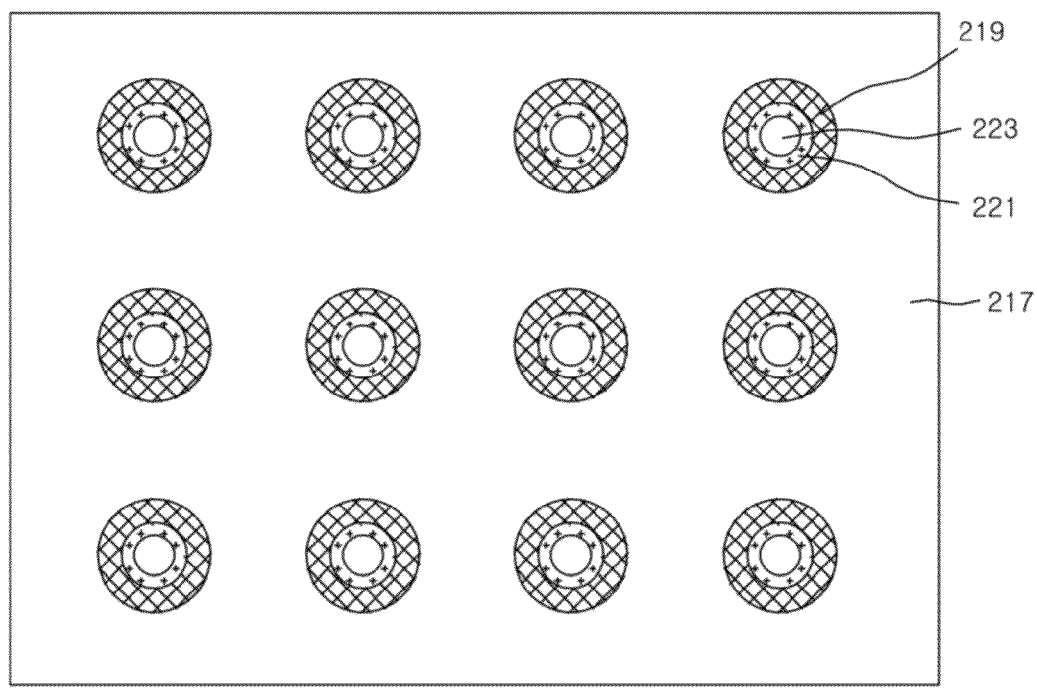

FIG. 12 is a plan view after the process of forming the gap-filling layer 223 is formed as illustrated in FIG. 10.

It can be seen from FIG. 12 that the spacer 219 is formed on the inner circumference of the lower portion of the lower electrode contact hole, the gap-filling layer 223 is buried in a center position of the lower electrode contact hole, and the lower electrode 221 is formed between the spacer 219 and the gap-filling layer 223.

The semiconductor memory device may include the access device D formed in a pillar type on the semiconductor substrate, the first conductive layer 207 formed in a self-aligned manner with the access device D, the protection layer formed on an edge of the first conductive layer 207 to a predetermined thickness and a width, and the lower electrode 221 connected to the first conductive layer 207.

In the exemplary embodiment of the inventive concept, when the access device and the lower electrode are formed in a self-aligned manner, the protection layer is introduced below the sacrificial layer to prevent the underlying structure from being removed when the sacrificial layer is removed. Therefore, the underlying structure below the sacrificial layer is substantially maintained when the sacrificial layer is removed, and therefore, fabricating reliability of the device may be improved.

When the semiconductor memory device is fabricated, the access device and the lower electrode are formed in a self-aligned manner to reduce the number of patterning processes and to prevent misalignment due to overlay failure. Loss of a conductive layer, which stabilizes electric contact characteristic between the access device and the lower electrode, is minimized, and thus, a failure rate of the device may be improved and fabrication yield may also be improved.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor memory device, comprising:
   an access device formed in a pillar shape on a semiconductor substrate;
   a first conductive layer formed over the access device;
   a protection layer formed an edge of the first conductive layer to a predetermined thickness;
   a lower electrode formed over the first conductive layer and electrically connected to the first conductive layer; and
   a spacer formed over the protection layer to surround an outer circumference of the lower electrode.

2. The semiconductor memory device of claim 1, wherein the protection layer is comprised of substantially the same material as the spacer.

3. The semiconductor memory device of claim 1, wherein the protection layer includes a material having the same or similar etching properties as the spacer.

* * * * *